(12) United States Patent
Cheim

(10) Patent No.: US 10,748,702 B2
(45) Date of Patent: Aug. 18, 2020

(54) TRANSFORMER SYSTEM AND SYSTEM FOR MEASURING PRESSURE IN A TRANSFORMER TANK

(71) Applicant: ABB Power Grids Switzerland AG, Baden (CH)

(72) Inventor: Luiz V. Cheim, St. Charles, MO (US)

(73) Assignee: ABB Power Grids Switzerland AG, Baden (CH)

( * ) Notice: Subject to any disclaimer, the term of this patent is extended or adjusted under 35 U.S.C. 154(b) by 289 days.

(21) Appl. No.: 15/581,784

(22) Filed: Apr. 28, 2017

(65) Prior Publication Data

US 2018/0315546 A1 Nov. 1, 2018

(51) Int. Cl.
| | |
|---|---|
| *H01F 27/40* | (2006.01) |
| *G01R 31/12* | (2020.01) |
| *G01M 11/08* | (2006.01) |
| *G01D 5/353* | (2006.01) |
| *G01L 11/02* | (2006.01) |
| *G01L 9/00* | (2006.01) |
| *H01F 29/00* | (2006.01) |

(52) U.S. Cl.
CPC ....... *H01F 27/402* (2013.01); *G01D 5/35312* (2013.01); *G01D 5/35316* (2013.01); *G01L 9/0079* (2013.01); *G01L 11/025* (2013.01); *G01M 11/085* (2013.01); *G01R 31/1263* (2013.01); *H01F 29/00* (2013.01); *H01F 2027/404* (2013.01)

(58) Field of Classification Search
CPC .. H01F 29/00; H01F 2027/404; H01F 27/402; G01D 5/35316; G01D 5/35312; G01D 9/0079; G01L 9/0079; G01L 11/025; G01M 11/085; G01R 31/1263

USPC .......................................................... 361/37
See application file for complete search history.

(56) References Cited

U.S. PATENT DOCUMENTS

| | | | | |
|---|---|---|---|---|
| 3,404,247 A | * | 10/1968 | Glassanos ............. | H01F 27/402 218/118 |
| 3,680,359 A | * | 8/1972 | Lynch ................... | H01F 27/402 73/23.21 |
| 4,718,263 A | * | 1/1988 | Crout ........................ | B21J 7/46 700/145 |

(Continued)

FOREIGN PATENT DOCUMENTS

CN 201107631 Y 8/2008

OTHER PUBLICATIONS

Quiett, et al., The Design of Fiber Optic Sensors for Measuring Hydrodynamic Parameters, Research Center for Optical Physics, Hampton University, 13 pages.

(Continued)

*Primary Examiner* — Yusef A Ahmed
(74) *Attorney, Agent, or Firm* — Sage Patent Group

(57) ABSTRACT

A transformer system includes a transformer and a transformer tank. The transformer tank houses the transformer in a bath of a dielectric fluid. The transformer system also includes a controller, and a fiber optic pressure sensor communicatively coupled to the controller. The fiber optic sensor is disposed in the dielectric fluid and operative to provide an output that varies with the pressure of the dielectric fluid. The controller is operative to determine the pressure of the dielectric fluid based on the output of the fiber optic pressure sensor.

19 Claims, 2 Drawing Sheets

(56) References Cited

U.S. PATENT DOCUMENTS

| | | | | |
|---|---|---|---|---|
| 5,072,617 A * | 12/1991 | Weiss | G01F 23/164 | |
| | | | 73/293 | |
| 5,200,610 A * | 4/1993 | Zuckerwar | G01L 9/0077 | |
| | | | 250/227.21 | |
| 6,016,702 A * | 1/2000 | Maron | G01L 9/0039 | |
| | | | 73/705 | |
| 6,167,965 B1 * | 1/2001 | Bearden | E21B 43/121 | |
| | | | 166/250.15 | |
| 7,071,701 B2 | 7/2006 | Roman et al. | | |
| 7,365,856 B2 | 4/2008 | Everett et al. | | |
| 7,377,689 B2 | 5/2008 | Balan | | |
| 8,568,025 B2 | 10/2013 | Meilleur et al. | | |
| 9,484,146 B2 | 11/2016 | Hinz et al. | | |
| 2008/0124020 A1 * | 5/2008 | Niewczas | G01R 15/24 | |
| | | | 385/13 | |
| 2008/0192389 A1 * | 8/2008 | Muench | H02H 1/0023 | |
| | | | 361/5 | |
| 2013/0271166 A1 | 10/2013 | Bouffard et al. | | |
| 2015/0369751 A1 * | 12/2015 | Cheim | G01N 21/95 | |
| | | | 702/40 | |
| 2016/0118186 A1 * | 4/2016 | Frimpong | H01F 27/025 | |
| | | | 307/119 | |
| 2017/0168034 A1 * | 6/2017 | Fenton | G01N 33/0036 | |
| 2018/0114630 A1 * | 4/2018 | Neumueller | H01F 27/303 | |
| 2018/0128673 A1 * | 5/2018 | Oshetski | H01F 27/402 | |
| 2018/0158542 A1 * | 6/2018 | Kim | G16H 15/00 | |
| 2018/0315538 A1 * | 11/2018 | Cheim | H01F 27/10 | |
| 2020/0098513 A1 * | 3/2020 | Zhang | H01F 27/402 | |
| 2020/0114393 A1 * | 4/2020 | Frimpong | B05D 7/56 | |

OTHER PUBLICATIONS

Vargas, et al., A plastic fiber optic liquid level sensor, Proceedings of SPIE, The International Society for Optical Engineering, Jun. 2004, 5 pages.

Pinet, Pressure measurement with fiber-optic sensors: Commercial technologies and applications, 21st International Conference on Optical Fiber Sensors, SPIE vol. 7753 775304-1, 4 pages.

* cited by examiner

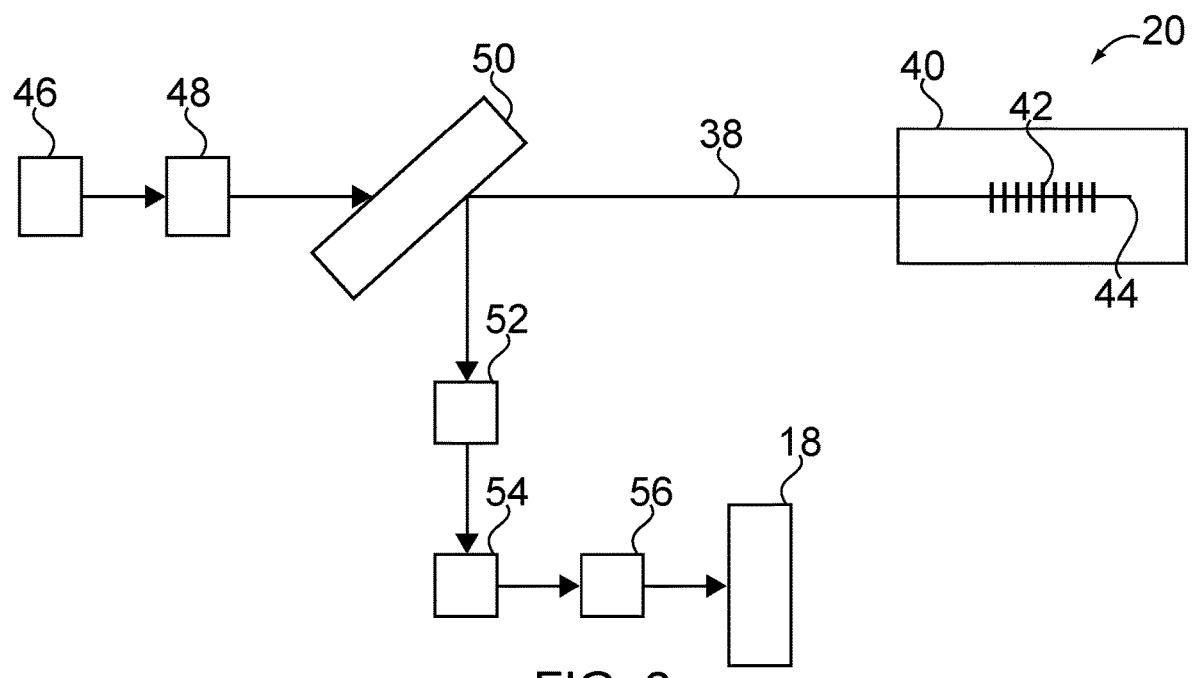
FIG. 2
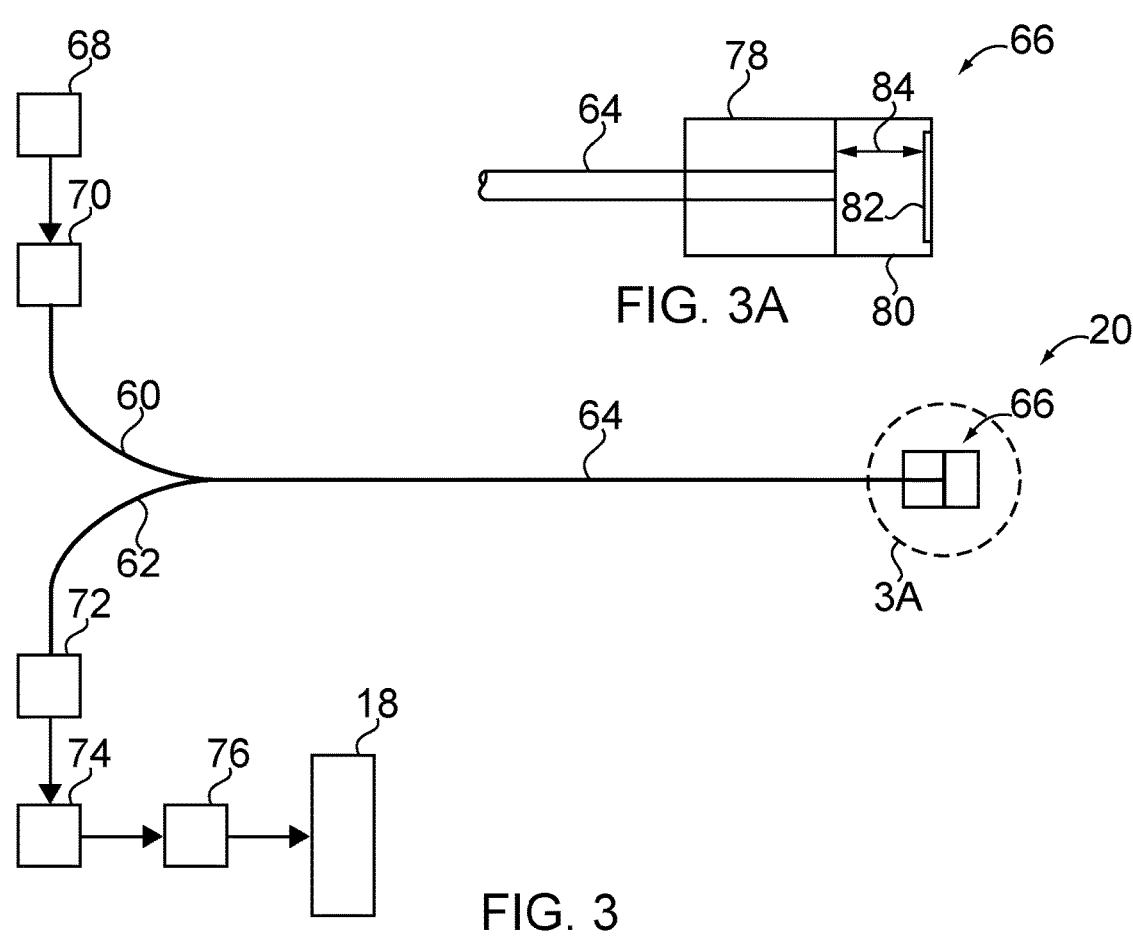
FIG. 3A
FIG. 3

TRANSFORMER SYSTEM AND SYSTEM FOR MEASURING PRESSURE IN A TRANSFORMER TANK

TECHNICAL FIELD

The present application generally relates to electrical systems, and more particularly, but not exclusively, to transformer systems and systems for measuring dielectric fluid pressure in in a transformer tank.

BACKGROUND

Transformer systems of various types, e.g., high power high voltage transformer systems, remain an area of interest. Some existing systems have various shortcomings, drawbacks and disadvantages relative to certain applications. For example some transformer systems may not be able to detect a ballistic impact. Accordingly, there remains a need for further contributions in this area of technology.

SUMMARY

One embodiment of the present invention is a unique transformer system. Another embodiment is unique system for measuring pressure in a dielectric fluid in a transformer tank. Another embodiment is a unique transformer system. Other embodiments include apparatuses, systems, devices, hardware, methods, and combinations for transformer systems and for systems for measuring pressure in a dielectric fluid in a transformer tank. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein:

FIG. 2 schematically illustrates some aspects of a non-limiting example of a fiber optic sensor in the form of a fiber Bragg grating sensor that may be employed in accordance with an embodiment of the present invention.

FIGS. 3 and 3A schematically illustrate some aspects of a non-limiting example of a fiber optic sensor in the form of a Fabry-Perot cavity sensor that may be employed in accordance with an embodiment of the present invention.

DETAILED DESCRIPTION OF THE ILLUSTRATIVE EMBODIMENTS

Figure 1:
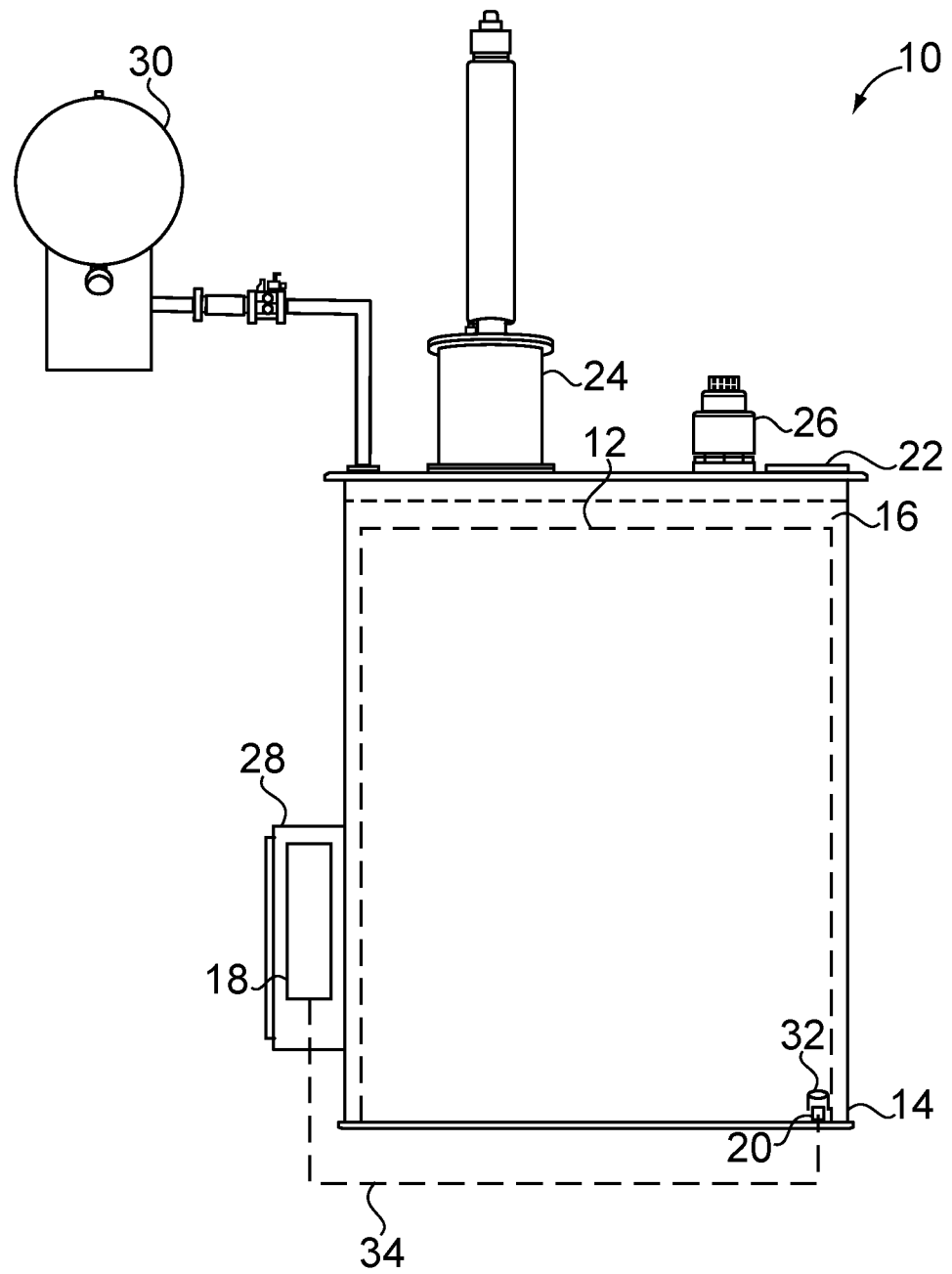
FIG. 1 schematically illustrates a side view of some aspects of a non-limiting example of a transformer system in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, a side view of some aspects of a non-limiting example of a transformer system 10 in accordance with an embodiment of the present invention is schematically illustrated. Transformer system 10 includes a transformer 12, and a transformer tank 14. In one form, transformer 12 is a high voltage (HV) transformer. In other embodiments, transformer 12 may be a medium voltage (MV) or low voltage (LV) transformer. Transformer 12 is housed within transformer tank 14 in a bath of coolant, e.g., a dielectric fluid 16, such as mineral oil or another dielectric oil or SF6 (sulfur hexafluoride). Some embodiments may include one or more radiators operative to extract heat from dielectric fluid 16.

Transformer system 10 also includes a controller 18; a fiber optic sensor 20; an access panel 22; a plurality of turrets 24 and 26; a control cabinet 28, e.g., housing controller 18; a conservator 30 and a drain valve 32. In some embodiments, transformer tank 14, turrets 24 and 26, control cabinet 28 and/or conservator 30 may be hardened in order to provide protection against ballistic impact. It will be understood that the term, "ballistic impact" includes impacts by bullets or other projectiles fired by weapons, e.g., rifles, shotguns or handguns, and in some embodiments includes impacts by other objects, e.g., objects thrown by a human, or objects sent on a ballistic trajectory to strike tank 14 or another transformer system 10 component by other means. The term, "hardened," as used herein, refers to hardening against damage due to ballistic impact, e.g., against a ballistic bullet or other impact and/or preventing a loss of dielectric fluid 16 after a ballistic impact. Hardening may be achieved, for example, as set forth in International Publication No. WO 2016/065143 A2, which is incorporated herein by reference. For example, transformer tank 14, turrets 24 and 26, control cabinet 28 and/or conservator 30 may be constructed of ½" AR500 armor steel and provided with a ½" polyurea coating configured to meet UL Standard 752, Level 10 ballistic rating.

In one form, controller 18 is housed within control panel 28. In other embodiments, controller 18 may be disposed at other locations. Fiber optic sensor 20 is communicatively coupled to controller 18 via a communications link 34. In one form, communications link 34 is a wired connection. In other embodiments, communications link 34 may be a wireless connection. In some embodiments, communications link 34 may be an optical link, e.g., including an extension of the fiber optic bundle or bundles used to form part of fiber optic sensor 20, or may be another optical link.

In one form, fiber optic sensor 20 is inserted into transformer tank 14 at drain valve 32, and disposed or submerged in dielectric fluid 16. In other embodiments, fiber optic sensor 20 may be inserted into transformer tank 14 at other locations, e.g., access panel 22, and disposed or submerged in dielectric fluid 16. The depth to which fiber optic sensor 20 is submerged may vary with the needs of the application. In one form, fiber optic sensor 20 is disposed at or near the bottom of transformer tank 14, submerged in dielectric fluid 16. In other embodiments, fiber optic sensor 20 may be disposed at other locations, e.g., other depths, submerged in dielectric fluid 16.

In one form, fiber optic sensor 20 is operative to provide an output that varies with the pressure of dielectric fluid 16. In some embodiments, fiber optic sensor 20 is also or alternatively operative to provide an output that varies with the dielectric fluid 16 level in transformer tank 14, e.g., based on the pressure head associated with the column of dielectric fluid 16 disposed above fiber optic sensor 20. In one form, controller 18 is operative to determine the pressure of dielectric fluid 16 at the location of fiber optic sensor 20 based on the output of fiber optic sensor 20. In other embodiments, controller 18 is also or alternatively operative to determine the dielectric fluid 16 level, based on the output of fiber optic sensor 20. In one form, fiber optic sensor 20 is a pressure sensor. Fiber optic sensor 20 may be any type of fiber optic sensor configured and calibrated to sense pressure. In some embodiments, fiber optic sensor 20 is a fiber Bragg grating sensor. In other embodiments, fiber optic sensor 20 may be a Fabry-Perot cavity sensor, e.g., a Fabry-Perot resonant cavity sensor. In still other embodiments, fiber optic sensor 20 may be another type of fiber optic sensor.

Referring to FIG. 2, some aspects of a non-limiting example of fiber optic sensor 20 in the form of a fiber Bragg grating sensor that may be employed in accordance with an embodiment of the present invention are schematically illustrated. In the embodiment of FIG. 2, fiber optic sensor 20 includes a fiber optics bundle 38, a housing 40, a Bragg grating 42, a fiber termination 44, a light source 46, a collimating lens 48, a beam splitter 50, a collimating lens 52, a photodiode 54 and an electronic circuit 56. In some embodiments, electronic circuit 56 may be a part of controller 18. The end of fiber optics bundle 38 is disposed in housing 40, which is flexible and elastic e.g., formed of an epoxy or another flexible, elastic material. Some embodiments may not include a housing. In some embodiments, housing 40 may simply be a coating applied to fiber optics bundle 38. The end portion of fiber optics bundle 38 includes Bragg grating 42, and terminates at fiber termination 44, e.g., a light-absorbing, non-reflective fiber termination or low-reflectivity fiber termination. Light is supplied to fiber optics bundle 38 from light source 46 via collimating lens 48 and beam splitter 50.

The fiber Bragg grating varies in response to physical changes to fiber optics bundle 38, e.g., including pressure, and hence, the wavelength of light reflected by the Bragg grating and the wavelength of the light transmitted through the Bragg grating shifts or varies with changes in dielectric fluid 16 pressure. The variation with pressure occurs because the fiber optic bundle is sufficiently flexible such that changes in pressure cause changes in the length and internal spacing of the Bragg grating, i.e., longitudinal expansion or contraction of the Bragg grating, which changes the light reflectance and transmittance characteristics of the Bragg grating. During operation, the light reflected by the fiber Bragg grating is transmitted through fiber optics bundle 38, and reflected off of beam splitter 50 into collimating lens 52 and then into photodiode 54. Because the wavelength of the light reflected from the fiber Bragg grating varies with dielectric fluid 16 pressure, the output of photodiode 54 varies with dielectric fluid 16 pressure, e.g., based on the output characteristic response of photodiode 54. Light source 46 output characteristics, fiber optics bundle 38 optical and mechanical characteristics, fiber Bragg grating 42 parameters and photodiode 54 response characteristics may be selected to optimize the response of fiber optic sensor 20 to changes in pressure in dielectric fluid 16, and to tune the response of fiber optic sensor 20 to achieve operation and the desired sensitivity in the desired pressure range. In some embodiments, light source 46 and collimating lens 48 may disposed at the opposite end of fiber bundle 38, and the light transmitted through the Bragg grating may be detected by photodiode 54 instead of the light reflected by the Bragg grating, e.g., without the need for a beam splitter. Whether reflected light or transmitted light is detected by photodiode 54, fiber optic sensor 20

Electronic circuit 56, e.g., an operational amplifier circuit, converts the output from photodiode 54 into a voltage output. The voltage output of electronic circuit 56 varies with changes in dielectric fluid 16 pressure, e.g., proportionally to the output of photodiode 54. The voltage output from electronic circuit 56 is supplied to controller 18. Controller 18 is operative to determine the pressure in dielectric fluid 16 at the location of fiber optic pressure sensor 20, e.g., by comparing the output of electronic circuit 56 with a lookup table, e.g., generated based on known or determined calibration values. In some embodiments, controller 18 is operative to determine the dielectric fluid 16 level at the location of fiber optic sensor 20, e.g., by comparing the output of electronic circuit 56 with a lookup table, e.g., generated based on known or determined calibration values. For example, the height of the column of dielectric fluid 16 above fiber optic sensor 20 correlates with the static head pressure of dielectric fluid 16 at the location of fiber optic sensor 20, which may be sensed by fiber optic sensor 20 and converted to height or dielectric fluid 16 level by use of a lookup table or known or determined calibration values.

Referring to FIGS. 3 and 3A, some aspects of a non-limiting example of fiber optic sensor 20 in the form of a Fabry-Perot cavity sensor that may be employed in accordance with an embodiment of the present invention are schematically illustrated. Fiber optic sensor 20 of the embodiment of FIGS. 3A and 3B includes an input fiber optic bundle 60, an output fiber optic bundle 62, a combined fiber optic bundle 64, a Fabry-Perot cavity assembly 66, a light source 68, a collimating lens 70, a collimating lens 72, a photodiode 74 and an electronic circuit 76. In some embodiments, electronic circuit 76 may be a part of controller 18.

Fabry-Perot cavity assembly 66 includes a fiber optic bundle housing 78, a mirror support 80 and a mirror 82. In some embodiments, mirror support 80 may be a flexible diaphragm. In some embodiments, mirror 82 may be flexible. Fiber optic housing 78 houses combined fiber optic bundle 64, and secures combined fiber optic bundle 64 to Fabry-Perot cavity assembly 66.

Input fiber optic bundle 60 and output fiber optic bundle 62 combine to form combined fiber optic bundle 64. Light source 68 directs light into input fiber optic bundle 60 via collimating lens 70. The light enters the cavity formed between fiber optic bundle housing 78, mirror support 80 and mirror 82, and impinges on mirror 82. Part of the light is reflected from mirror 82 back into through combined fiber optic bundle 64 and into output fiber optic bundle 62, which is directed to photodiode 74 via collimating lens 72. Reflectance of the cavity varies with a cavity length 84, and generates a fringe pattern of light. The reflected light intensity changes with cavity length 84. Cavity length 84 may vary, for example, with the pressure of dielectric fluid 16 at the location of fiber optic sensor 20. For example, variation in pressure of dielectric fluid 16 causes expansion or contraction of cavity length 84 because of flexure or displacement of mirror support 80 and/or mirror 82. The mechanical characteristics of mirror support 80, the optical and mechanical characteristics of mirror 82, and the photodiode 74 response characteristics may be selected to optimize the response of fiber optic sensor 20 to changes in pressure in dielectric fluid 16, and to tune the response of fiber optic sensor 20 to achieve operation and the desired sensitivity in the desired pressure range.

Electronic circuit 76, e.g., an operational amplifier circuit, converts the output from photodiode 74 into a voltage output. The voltage output of electronic circuit 76 varies with changes in dielectric fluid 16 pressure, e.g., proportionally to the output of photodiode 74. The voltage output from electronic circuit 76 is supplied to controller 18. Controller 18 is operative to determine the pressure in dielectric fluid 16 at the location of fiber optic pressure sensor 20, e.g., by comparing the output of electronic circuit 76 with a lookup table, e.g., generated based on known or determined calibration values of oil pressure changes vs. light intensity output, e.g., as a function of wavelength. In some embodiments, controller 18 is operative to determine the dielectric fluid 16 level at the location of fiber optic sensor 20, e.g., by comparing the output of electronic circuit 76 with a lookup table, e.g., generated based on known or determined calibration values. For example, the height of the column of dielectric fluid 16 above fiber optic sensor 20 correlates with the static head pressure of dielectric fluid 16 at the location of fiber optic sensor 20, which may be sensed by fiber optic sensor 20 and converted to height or dielectric fluid 16 level by use of a lookup table using known or determined calibration values.

In some embodiments, controller 18 is operative to determine the occurrence of a ballistic impact, based on the output of fiber optic sensor 20. In some embodiments, the determination may be made by comparing a current dielectric fluid 16 pressure to a previous dielectric fluid pressure. For example, in some circumstances, a ballistic impact may generate a pressure pulse that travels through dielectric fluid 16, e.g., propagating away at the point of impact or penetration of transformer tank 14, yielding a temporary increase in the pressure of dielectric fluid 16. As the pulse passes across fiber optic sensor 20, a current dielectric fluid 16 pressure is determined, which is compared to the dielectric fluid 16 pressure prior to the pressure pulse passing through, e.g., a previous dielectric fluid 16 pressure. If the difference exceeds some predetermined value, a ballistic impact is deemed to have occurred. Thus, in some embodiments, controller 18 is operative to determine the occurrence of the ballistic impact based on a temporary increase, in the pressure of dielectric fluid 16. In some embodiments, the time between dielectric fluid 16 level measurements may be relatively short, and if the pressure increase takes place within some predetermined time period, the increase in dielectric fluid 16 level may be deemed by controller 16 to be a sudden increase, in which case a ballistic impact may be deemed by controller 18 to have occurred.

In some embodiments, controller 18 is operative to determine if the dielectric fluid 16 pressure caused by the pressure pulse exceeds a predetermined threshold. In such embodiments, the pressure is not compared to a previous dielectric fluid 16 pressure value and the difference compared to a predetermined value, but rather, the pressure itself is compared to the predetermined threshold. If the pressure exceeds the threshold, a ballistic impact is deemed to have occurred.

In some circumstances, the ballistic impact may generate a wave, e.g., a physical wave, propagating away from the point of ballistic impact or penetration of transformer tank 14. The wave results in a temporary and local increase in the level of dielectric fluid 16, i.e., in the height of the column of dielectric fluid above fiber optic sensor 20 as the wave passes over fiber optic sensor 20. Controller 18 is operative to determine the level of dielectric fluid 16 based on the output of fiber optic sensor 20, e.g., to determine the level based on the pressure sensed by fiber optic sensor 20. As the wave passes over the location of fiber optic sensor 20, a current dielectric fluid 16 level is determined, which is compared to the dielectric fluid 16 level prior to the wave passing over fiber optic sensor 20, e.g., a previous dielectric fluid 16 level. If the difference between the current and previous dielectric fluid 16 levels exceeds some predetermined value, a ballistic impact is deemed to have occurred.

In some embodiments, the time between dielectric fluid 16 level measurements may be relatively short, and the increase in dielectric fluid 16 level may be deemed by controller 16 to be a sudden increase in level. In such embodiments, controller 18 may be operative to determine the occurrence of a ballistic impact based on a sudden change, e.g., a sudden increase in dielectric fluid 16 level.

In some embodiments, controller 18 is operative to determine if the dielectric fluid 16 level caused by the wave exceeds a predetermined threshold. In such embodiments, the level is not compared to a previous dielectric fluid 16 pressure value and the difference compared to a predetermined value, but rather, the level itself is compared to a predetermined threshold. If the dielectric fluid 16 level exceeds the threshold, a ballistic impact is deemed to have occurred by controller 18.

In some circumstances, a ballistic impact may cause dielectric fluid 16 to leak out of transformer tank 14, in which case dielectric fluid 16 level would fall. Controller 18 is operative determine the occurrence of a ballistic impact based on the reduction in dielectric fluid level 16 exceeding some predetermined value. In some embodiments, controller 18 may be operative to determine the occurrence of a ballistic impact if the rate of change of dielectric fluid 16 level exceeds some predetermined threshold.

In some embodiments, fiber optic sensor 20 may be calibrated to sense head pressure, and controller 18 may be operative to determine the occurrence of a ballistic impact based on the dielectric fluid 16 head pressure resulting from the wave passing over fiber optic sensor 20, e.g., based on the a change or sudden change (increase) in the head pressure exceeding a predetermined value, or based on the head pressure exceeding a predetermined threshold or dropping below another predetermined value, or based on a rate of change of head pressure (e.g., a negative rate of change of head pressure in the event of a dielectric fluid 16 leak stemming from a ballistic impact) exceeding a predetermined threshold.

Upon determination that a ballistic impact occurred, controller 18 is operative to transmit a signal indicating the occurrence of the ballistic impact, e.g., to local substation personnel or remotely via a network. For example, notification of the occurrence of the ballistic impact may be sent via a SCADA (Supervisory Control And Data Acquisition) system/network, Modbus, an intranet, the Internet, or any other suitable communications network or system. In some embodiments, controller 18 is an Internet of Things component, able to transmit and receive information and be controlled and/or monitored via the Internet. The notification warns the operator of transformer system 10 to attend to transformer system 10 after the ballistic impact. In some embodiments, notification may also or alternatively be made to a law enforcement agency.

Embodiments of the present invention include a transformer system, comprising: a transformer; a transformer tank housing the transformer in a bath of a dielectric fluid; a controller; and a fiber optic pressure sensor communicatively coupled to the controller, disposed in the dielectric fluid and operative to provide an output that varies with a pressure of the dielectric fluid, wherein the controller is operative to determine the pressure of the dielectric fluid based on the output of the fiber optic pressure sensor.

In a refinement, the controller is operative to determine an occurrence of a ballistic impact on the transformer tank based on the output of the fiber optic pressure sensor.

In another refinement, the controller is operative to determine the occurrence of the ballistic impact by comparing a current dielectric fluid pressure to a previous dielectric fluid pressure or to a threshold.

In yet another refinement, the controller is operative to determine the occurrence of the ballistic impact based on a temporary increase in the pressure of the dielectric fluid.

In still another refinement, the controller is operative to transmit a signal indicating the occurrence of the ballistic impact.

In yet still another refinement, the controller is operative to transmit the signal over the Internet.

In a further refinement, the fiber optic pressure sensor is a fiber Bragg grating sensor.

In a yet further refinement, the fiber optic pressure sensor is a Fabry-Perot cavity sensor.

Embodiments of the present invention include a system for measuring pressure in a dielectric fluid in a transformer tank housing a transformer in a bath of the dielectric fluid, comprising: a controller; and a fiber optic pressure sensor communicatively coupled to the controller, disposed within the dielectric fluid and operative to provide an output that varies with a pressure of the dielectric fluid, wherein the controller is operative to determine the pressure of the dielectric fluid based on the output of the fiber optic pressure sensor.

In a refinement, the controller is operative to determine an occurrence of a ballistic impact on the transformer tank based on the output of the fiber optic pressure sensor.

In another refinement, the controller is operative to determine the occurrence of the ballistic impact by comparing a current dielectric fluid pressure to a previous dielectric fluid pressure.

In yet another refinement, the controller is operative to determine the occurrence of the ballistic impact based on a temporary increase in the pressure of the dielectric fluid.

In still another refinement, the controller is operative to transmit a signal indicating the occurrence of the ballistic impact.

In yet still another refinement, the controller is operative to transmit the signal over the Internet.

In a further refinement, the fiber optic pressure sensor is a fiber Bragg grating sensor.

In a yet further refinement, the fiber optic pressure sensor is a Fabry-Perot cavity sensor.

Embodiments of the present invention include a transformer system, comprising: a transformer; a transformer tank housing the transformer in a bath of a dielectric fluid; a controller; and means for sensing pressure communicatively coupled to the controller and disposed in the dielectric fluid and operative to provide an output that varies with a pressure of the dielectric fluid, wherein the controller is operative to determine the pressure of the dielectric fluid based on the output of the means for sensing pressure.

In a refinement, the controller is operative to determine an occurrence of a ballistic impact on the transformer tank based on the pressure of the dielectric fluid exceeding a threshold.

In another refinement, the means for sensing pressure is a fiber Bragg grating sensor.

In another refinement, the means for sensing pressure is a Fabry-Perot cavity sensor.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A transformer system, comprising:
   a transformer;
   a transformer tank housing the transformer in a bath of a dielectric fluid;
   a controller; and
   a fiber optic pressure sensor communicatively coupled to the controller, the fiber optic pressure sensor including a fiber optics bundle disposed and submerged in the dielectric fluid in the transformer tank and operative to provide an output that varies with a pressure of the dielectric fluid,
   wherein the controller is operative to determine the pressure of the dielectric fluid based on the output of the fiber optic pressure sensor;
   wherein the controller is operative to determine an occurrence of a ballistic impact on the transformer tank by determining a level of the dielectric fluid based on the output of the fiber optic pressure sensor and comparing the level of the dielectric fluid to a prior level of the dielectric fluid or to a threshold level of the dielectric fluid, and
   wherein the controller is operative to determine an occurrence of a ballistic impact on the transformer tank by determining, based on the output of the fiber optic pressure sensor, a rate of change of the level of the dielectric fluid in the transformer tank.

2. The transformer system of claim 1, wherein the controller is further operative to determine the occurrence of the ballistic impact by comparing a current dielectric fluid pressure to a previous dielectric fluid pressure or to a threshold.

3. The transformer system of claim 1, wherein the controller is further operative to determine the occurrence of the ballistic impact based on a temporary increase in the pressure of the dielectric fluid within a predetermined time period.

4. The transformer system of claim 1, wherein the controller is operative to transmit a signal indicating the occurrence of the ballistic impact.

5. The transformer system of claim 4, wherein the controller is an Internet of Things component, and is operative to transmit the signal over the Internet.

6. The transformer system of claim 1, wherein the fiber optic pressure sensor is a fiber Bragg grating sensor.

7. The transformer system of claim 1, wherein the fiber optic pressure sensor is a Fabry-Perot cavity sensor.

8. The transformer system of claim 1, wherein the controller is further operative to determine an occurrence of a ballistic impact on the transformer tank by determining, based on the output of the fiber optic pressure sensor, (1) a rate of change of a level of the dielectric fluid in the transformer tank, or (2) a rate of change of the pressure of the dielectric fluid based on the output of the fiber optic pressure.

9. A system for measuring pressure in a dielectric fluid in a bath of the dielectric fluid, comprising:
  a controller; and
  a fiber optic pressure sensor communicatively coupled to the controller, the fiber optic pressure sensor including a fiber optic bundle disposed within the dielectric fluid in a tank housing that houses a transformer in the bath of the dielectric fluid, the fiber optic bundle operative to provide an output that varies with a pressure of the dielectric fluid,
  wherein the controller is operative to determine the pressure of the dielectric fluid based on the output of the fiber optic pressure sensor;
  wherein the controller is operative to determine an occurrence of a ballistic impact on the transformer tank by determining a level of the dielectric fluid based on the output of the fiber optic pressure sensor and comparing the level of the dielectric fluid to a prior level of the dielectric fluid or to a threshold level of the dielectric fluid, and
  wherein the controller is operative to determine the occurrence of a ballistic impact on the transformer tank by determining, based on the output of the fiber optic pressure sensor, a rate of change of the level of the dielectric fluid in the transformer tank.

10. The system of claim 9, wherein the controller is further operative to determine the occurrence of the ballistic impact by comparing a current dielectric fluid pressure to a previous dielectric fluid pressure.

11. The system of claim 9, wherein the controller is further operative to determine the occurrence of the ballistic impact based on a temporary increase in the pressure of the dielectric fluid.

12. The system of claim 9, wherein the controller is operative to transmit a signal indicating the occurrence of the ballistic impact.

13. The system of claim 12, wherein the controller is operative to transmit the signal over the Internet.

14. The system of claim 9, wherein the fiber optic pressure sensor is a fiber Bragg grating sensor.

15. The system of claim 9, wherein the fiber optic pressure sensor is a Fabry-Perot cavity sensor.

16. A transformer system, comprising:
  a transformer;
  a transformer tank housing the transformer in a bath of a dielectric fluid;
  a controller; and
  means for sensing pressure communicatively coupled to the controller, the means including a fiber optic bundle submerged in the dielectric fluid in the transformer tank that houses the transformer and operative to provide an output that varies with a pressure of the dielectric fluid,
  wherein the controller is operative to determine the pressure of the dielectric fluid based on the output of the means for sensing pressure;
  wherein the controller is operative to determine an occurrence of a ballistic impact on the transformer tank by determining a level of the dielectric fluid based on the output of the fiber optic pressure sensor and comparing the level of the dielectric fluid to a prior level of the dielectric fluid or to a threshold level of the dielectric fluid, and
  wherein the controller is operative to determine the occurrence of a ballistic impact on the transformer tank by determining, based on the output of the fiber optic pressure sensor, a rate of change of the level of the dielectric fluid in the transformer tank.

17. The transformer system of claim 16, wherein the controller is further operative to determine an occurrence of a ballistic impact on the transformer tank based on the pressure of the dielectric fluid exceeding a threshold.

18. The transformer system of claim 16, wherein the means for sensing pressure is a fiber Bragg grating sensor.

19. The transformer system of claim 16, wherein the means for sensing pressure is a Fabry-Perot cavity sensor.

* * * * *